(12) United States Patent
Chen

(10) Patent No.: US 7,433,189 B2
(45) Date of Patent: Oct. 7, 2008

(54) ELECTRONIC DEVICE AND HEAT DISSIPATION MODULE THEREOF

(75) Inventor: Chien-Ying Chen, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 15 days.

(21) Appl. No.: 11/733,166

(22) Filed: Apr. 9, 2007

(65) Prior Publication Data

US 2007/0274040 A1 Nov. 29, 2007

(30) Foreign Application Priority Data

May 29, 2006 (TW) .............................. 95118964 A

(51) Int. Cl.
*H05K 7/20* (2006.01)
*H01L 23/467* (2006.01)

(52) U.S. Cl. ................ 361/695; 361/687; 361/688; 361/690; 165/80.3; 165/104.33; 257/719; 24/453

(58) Field of Classification Search ................ 361/687, 361/688, 689, 690–697, 704–712, 717–721; 165/80.2, 80.3, 80.4, 104.33, 121–127, 185; 257/717–727; 454/184; 24/297, 453, 459, 24/508, 628, 913; 174/16.1, 16.3, 252
See application file for complete search history.

(56) References Cited

U.S. PATENT DOCUMENTS

| | | | | |
|---|---|---|---|---|
| 6,130,820 A | * | 10/2000 | Konstad et al. | ............. 361/695 |
| 6,304,442 B1 | * | 10/2001 | Tucker et al. | ............... 361/695 |
| 6,386,785 B1 | * | 5/2002 | Horng | ......................... 403/14 |
| 6,775,139 B2 | | 8/2004 | Hsueh | |
| 7,023,701 B2 | | 4/2006 | Stocken et al. | |
| 2006/0201658 A1 | * | 9/2006 | Otsuki et al. | ................ 165/125 |

FOREIGN PATENT DOCUMENTS

WO WO2006042635 A1 * 4/2006

* cited by examiner

*Primary Examiner*—Michael V Datskovskiy
(74) *Attorney, Agent, or Firm*—Jianq Chyun IP Office

(57) ABSTRACT

A heat dissipation module is suitable for being assembled on a circuit board to dissipate the heat source on the circuit board. The heat dissipation module includes a holding unit, a fan and a cover unit. The holding unit is formed by a holder base and multiple first support posts extending from the holder base downwards, each of the first support posts has an elastic snap sleeve to be snapped in a snap hole and the elastic snap sleeve has an accommodation space. The fan is assembled on the holder base and the cover unit covers the fan and is assembled on the holding unit, and an end of each second support post of the fan has a snap tenon plugged in the accommodation space.

18 Claims, 4 Drawing Sheets

ELECTRONIC DEVICE AND HEAT DISSIPATION MODULE THEREOF

CROSS-REFERENCE TO RELATED APPLICATION

This application claims the priority benefit of Taiwan application serial no. 95118964, filed May 29, 2006. All disclosure of the Taiwan application is incorporated herein by reference.

BACKGROUND OF THE INVENTION

1. Field of the Invention

The present invention relates to a heat dissipation module, and more particularly to an electronic device and the heat dissipation module thereof.

2. Description of the Related Art

Along with the continuous breakthroughs in semiconductor technology, the volume of an integral circuit (IC) component is being progressively miniaturized in order to meet the continued demand of faster operation speed. The operation of circuit generates heat and significantly increases the temperature of the electronic component. In particular, the higher the operation speed of an IC component, the more serious the increase of temperature gets. Usually, several IC components used by a computer hardware form a chip module to perform specific functions, wherein an excessively high working temperature, when not timely dissipated, would often lead to malfunction of the IC component, or even damage the IC component. Therefore, how to reduce the operating temperature of an IC component is a quite important project.

For example, multiple memory modules are usually plugged in a server to advance the performance. In the prior art, a memory module runs in parallel data transmission mode, wherein each of the module in a memory transmission channel holds a set of memory controllers to access the channel. Thus, the situation with quite many memory chips results in overload of the memory controller and results in data transmission error and delay. In addition, in the parallel data transmission mode, faster the speed of data transmission in a transmission channel, higher the probability of data errors is.

Therefore, for memory modules plugged in a server, a memory module running in serial data transmission mode, is a newly used solution such as a fully-buffered dual inline memory module (FB-DIMM), is adopted.

The FB-DIMM is evolved from a standard DDR2 memory specifically suitable for the server application. In server application, higher memory capacity, concordance among the memories under high-speed transmission and data correctness are the most essential requirements. To achieve a faster speed of data transmission, the FB-DIMM memory also takes advantage of the high-speed internal architecture of a DDR2 memory and makes the brand-new P2P (point-to-point) serial interfaces combined with each other for connecting in series all the FB-DIMM modules together.

However, the power consumption of an FB-DIMM memory controller is very significant; that is to say the memory controller thereof generates heat and increases the temperature to a very high level, for example, to 125° C. or so. If the heat generated by the FB-DIMM is not timely dissipated, the temperature rapidly increases to a very high level which adversely affect the 'system on a chip' (SoC) disposed adjacently thereto, and affects the system performance.

In conventional heat dissipation solutions, the main system is usually equipped with several system fans to produce active airflows for reducing the system temperature, or utilizes a higher grade system fan provide the required wind pressure and wind flow to dissipate the heat of the FB-DIMM. There are other measures as well, where a wind-guiding duct is used to lead the airflow produced by the fan to the FB-DIMM for cooling the memory modules.

It is noted that a system usually has a lot of power cords or multiple circuit board cards, such as cards of redundant array of independent disks (RAID cards) disposed therein. Therefore, the airflow produced by the system fan would be affected by the fluid resistance of the power cords or the circuit board cards, so as to fail to reach at the FB-DIMM through convection therefore the FB-DIMM may not be effectively cooled down.

Besides, the limited space inside the system may not allow to dispose a wind-guiding duct therein to bring the wind flow produced by a fan to a heat-generating component. Even for some situations where a successive space exists inside the main body for disposing a wind-guiding duct, the intensity of the airflow at the FB-DIMM produced by a system fan may be largely weakened after passing through the wind-guiding duct. So the airflow is too weak to effectively cool an electronic component.

Accordingly, how to effectively solve the heat dissipation problem is a very important issue for manufacturers.

SUMMARY OF THE INVENTION

The present invention is directed to an electronic device and a heat dissipation module thereof capable of effectively dissipating heat and thereby resolve the problems of the prior art described above.

The present invention provides a heat dissipation module suitable for being assembled by securing to multiple snap holes formed on an circuit board. The heat dissipating module is suitable for dissipating heat generated by at least one heat source disposed on the circuit board. The heat dissipation module includes a holding unit, a fan and a cover unit. The holding unit mentioned above further includes a holder base and multiple first support posts formed from extending the holder base downwards. The above-mentioned fan is assembled on a holder base to dissipate the heat source. The above-mentioned cover unit further includes a cover case to cover the fan and multiple second support posts corresponding to the first support posts; the second support posts combine with the first support posts, make the fan assembled between the holding unit and the cover unit.

According to an embodiment of the present invention, an electronic device is disclosed, which includes a circuit board and a heat dissipation module assembled on the circuit board. Wherein, multiple memory modules are disposed on the circuit board and the circuit board has multiple snap holes disposed around these memory modules. The heat dissipation module is assembled on the circuit board to dissipate the heat generated by memory modules. The heat dissipation module includes a holding unit, a fan and a cover unit. The above-mentioned holding unit further includes a holder base and multiple first support posts formed from extending the holder base downwards and the holding unit is assembled on the circuit board through the first support posts. The fan is assembled on the holder base to dissipate the heat generated by the heat source. The above-mentioned cover unit further includes a cover case covers the fan and multiple second support posts corresponding to the first support posts, and the second support posts combine with the first support posts, so as to make the fan assembled between the holding unit and the cover unit.

Thus, by using the heat dissipation module provided by an embodiment of the present invention, a better heat dissipation effect without changing the currently-used system dissipation mode may be implemented so that the overheating problem with the electronic components (for example, memory modules) in an electronic device would be effectively resolved.

In an embodiment of the present invention, the electronic device is a server, while in other embodiments, the electronic device may be a 2U RAID device (2U refers to an Intel® based dual processor) or a main body of computer.

In an embodiment of the present invention, the heat source is multiple memory modules, which are fully-buffered dual inline memory modules (FB-DIMMs) preferred. In other embodiments, the heat source may be a north bridge chip, a graphic chip, a card of redundant array of independent disks (RAID card) or other 'systems on a chip' (SoCs) assembled and disposed in the server (or an information processing device).

In an embodiment of the present invention, the snap tenon closely fits the inner wall of an elastic snap sleeve.

In an embodiment of the present invention, the elastic snap sleeve has multiple split slots passing to an accommodation space, so that multiple snappers are formed out of the elastic snap sleeve, wherein each of the snappers has a protrusion portion at an end thereof departing from the holder base for being snapped into a snap hole. The protrusion portion has, for example, a slide facet and a latch facet; the snappers are disposed in the snap hole by plugging in, so that the latch facets hold the bottom surface of the circuit board for latching.

In an embodiment of the present invention, the first support post has a guiding portion to guide the corresponding second support post, so as to plug the snap tenon of the second support post into the accommodation space.

In an embodiment of the present invention, the fan has multiple first snap portions, the holding unit further includes multiple second snap portions corresponding to the first snap portions and the first snap portions snap the corresponding second snap portions, wherein the first snap portions are, for example, locking holes, while the second snap portions are, for example, snap hooks.

In an embodiment of the present invention, the cover unit further includes at least one third snap portion disposed around the cover case, the holding unit further includes at least one fourth snap portion disposed around the holder base and the third snap portion and the fourth snap portion are snapped each other. Wherein, the third snap portion is, for example, a snap hook, while the fourth snap portion is, for example, a snap slot. It is also that the third snap portion can be a snap slot, while the fourth snap portion can be a snap hook.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
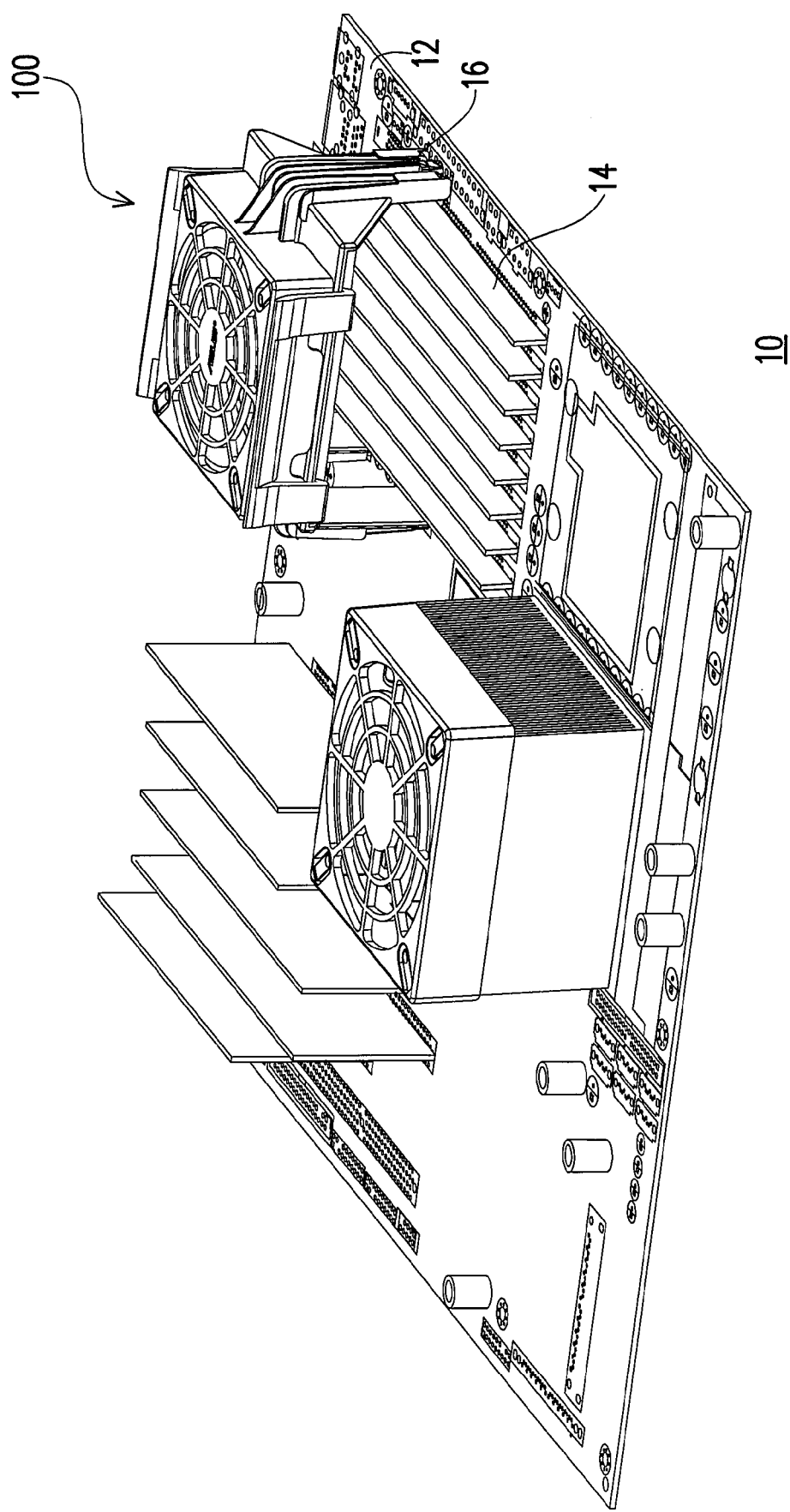
FIG. 1 is a diagram showing a heat dissipation module disposed in an electronic device according to an embodiment of the present invention.

FIG. 1 is a diagram showing a heat dissipation module 100 is disposed in an electronic device 10 according to an embodiment of the present invention. Referring to FIG. 1, a heat dissipation module 100 of the embodiment is suitable for being assembled on a circuit board 12 of an electronic device 10 to dissipate heat generated by a heat source 14 disposed on the circuit board 12, wherein the heat dissipation module 100 is assembled on the circuit board 12 by snapping the assembly members thereof into multiple snap holes 16 disposed around the heat source 14.

In the present embodiment, the electronic device 10 is a server, while in other embodiments, the electronic device 10 can be a 2U RAID device or a main body of a computer. In addition, the heat source 14 in the embodiment includes multiple memory modules, for example, FB-DIMMs. In other embodiments, the heat source 14 can be a north bridge chip, a graphic chip, an RAID card or other SoCs assembled and disposed in a server.

In the present embodiment, the heat dissipation module 100 is disposed over the memory modules to dissipate the FB-DIMMs, so as to secure the electronic device 10 in a stable operation status. In other embodiments, it allows the heat dissipation module 100 to dissipate heat generated by the other heat sources disposed on the circuit board 12 rather than the memory modules, to which the present invention does not limit. The heat dissipation module 100 of the present invention is explained in detail hereinafter.

Figure 2A:
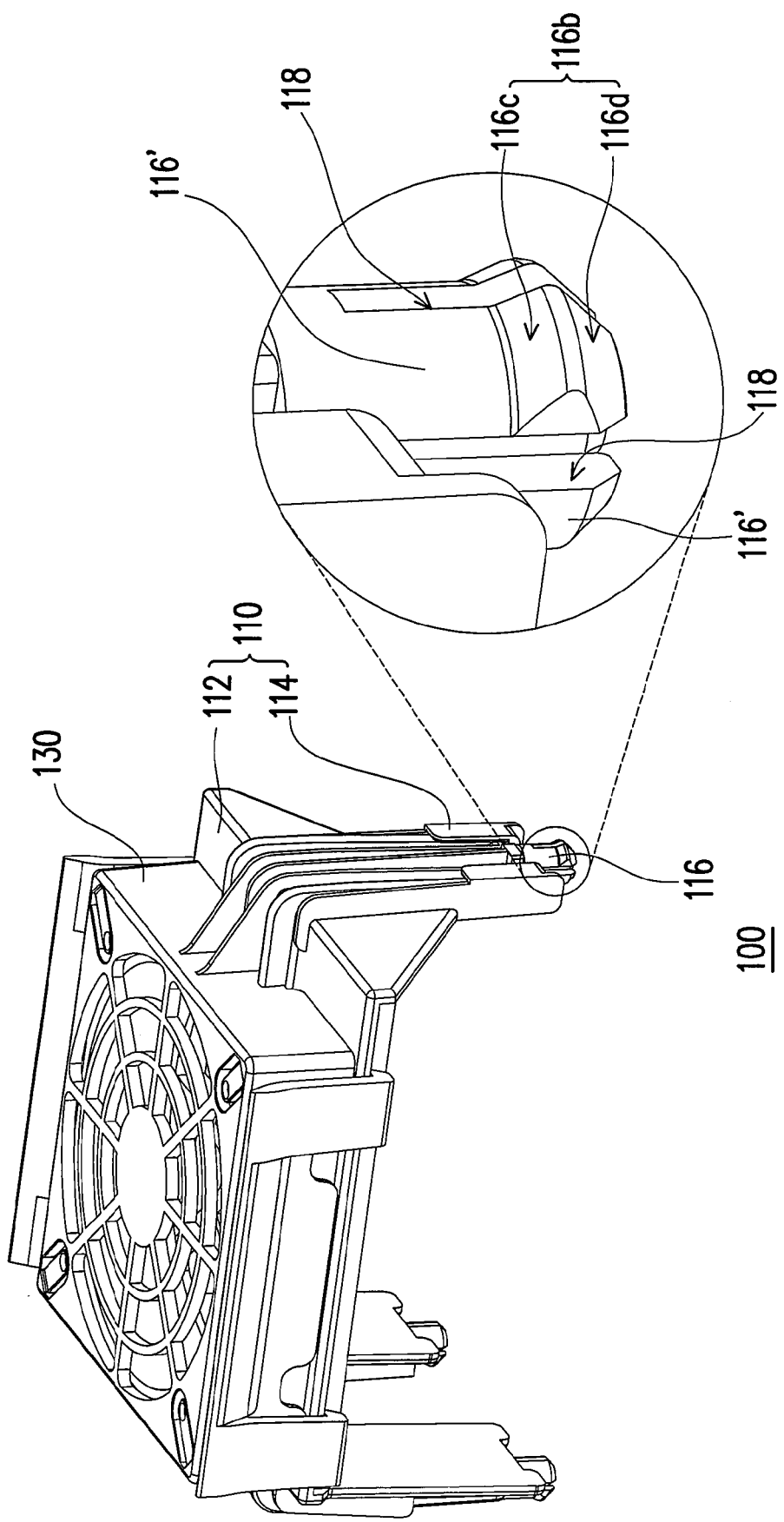
FIG. 2A is an enlarged drawing of the heat dissipation module in FIG. 1.
Figure 2B:
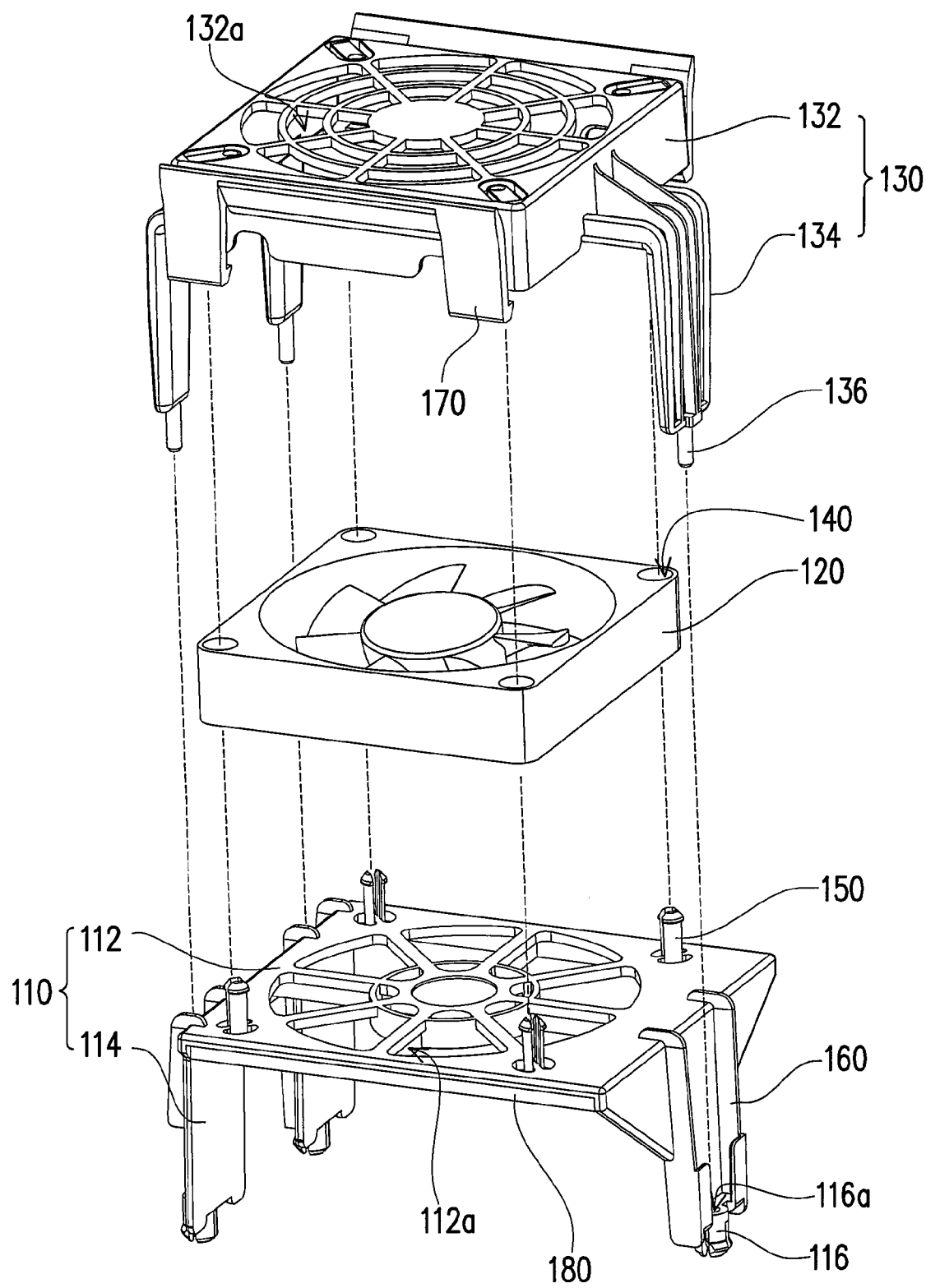
FIG. 2B is an exploded view of the heat dissipation module of FIG. 2A.

FIG. 2A is an enlarged view of the heat dissipation module 100 in FIG. 1 and FIG. 2B is an exploded view of the heat dissipation module of FIG. 2A. Referring to FIGS. 2A and 2B, the heat dissipation module 100 provided by the embodiment includes a holding unit 110, a fan 120 and a cover unit 130. The holding unit 110 includes a holder base 112 and multiple first support posts 114 formed by extending the holder base 112. In the embodiment, the first support posts 114 are formed from extending the holder base 112 downwards.

The above-mentioned holder base 112 has multiple first vent openings 112a; in other embodiments, the first vent opening 112a on the holder base 112 can be an opening or multiple openings, and the opening shape thereof can be different from the first vent opening 112a. Besides, each of the first support posts 114 further has an elastic snap sleeve 116, respectively; each of the elastic snap sleeves 116 further has an accommodation space 116a. The first support posts 114 can be elastically snapped into the snap holes 16 through the elastic snap sleeves 116 (referring to FIG. 1). The assembly of the elastic snap sleeve 116 is described in detail hereinafter.

The fan 120 is assembled on the holder base 112 of the holding unit 110 to dissipate heat generated by the heat source 14 (referring to FIG. 1). The fan 120 comprises multiple first snap portions 140 serving as locking holes according to an embodiment of the present invention. Multiple second snap portions 150 corresponding to the first snap portions 140 are disposed on the holder base 112 and the second snap portions 150 are snap hooks. In this way, the first snap portions 140 and the second snap portions 150 can be snapped to each other, so as to firmly secure the fan 120 on the holder base 112.

In other embodiments, the fan 120 can be assembled on the holder base 112 of the holding unit 110 in a different manner. For example, the fan 120 can be fixed on the holder base 112 by using screws and nuts, or directly adhered onto the holder base 112 or assembled by using any feasible method known to those skilled in the art.

One of the functions of the above-mentioned cover unit 130 is to fix the fan 120, so that the fan 120 would not come loose from the heat dissipation module 100 even if the electronic device 10 come loose. Another function of the cover unit 130 is to make the entire heat dissipation module 100 more firmly assembled on the circuit board 12 of the electronic device 10, where the cover unit 130 is combined with the holding unit 110, so as to make the holding unit 110 more firmly assembled with the circuit board 12 together. In the following, detail description is provided.

The above-mentioned cover unit 130 covers over the fan 120 and is assembled on the holding unit 110. The cover unit 130 includes a cover case 132 that covers the fan 120 and multiple second support post 134 corresponds to the first support post 114, wherein the second support posts 134 respectively combine the first support posts 114 to assemble the fan between the holding unit 110 and the cover unit 130.

In other words, the cover case 132 is used to cover the fan 120 and has multiple second vent openings 132a corresponding to the first vent openings 112a, so that the active airflow produced by the fan 120 is able to pass through the first vent openings 112a and the second vent openings 132a for cooling down the high temperature caused by the heat source 14. The second support posts 134 are extended downwards from the cover case 132 and the end departing from the cover case 132 of every second support post 134 has a snap tenon 136 to be plugged in the accommodation space 116a.

In the embodiment, the elastic snap sleeve 116 further has multiple split slots 118 to shape multiple snappers 116' out of the elastic snap sleeve 116. An end of each of the snappers 116' departing from the holder base 112 has a protrusion portion 116b and all the protrusion portions 116b are to be snapped into the snap holes 16, wherein the split slots 118 pass to the accommodation space 116a of the elastic snap sleeve 116.

Figure 3A:
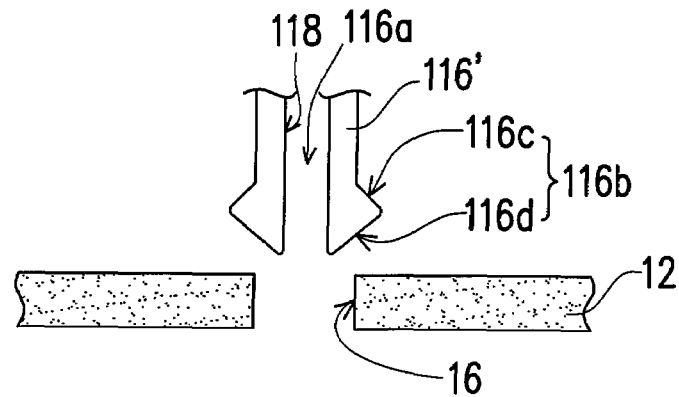
FIGS. 3A~3D are diagrams showing the process of assembling the elastic snap sleeve in FIG. 2B into a snap hole, followed by plugging the snap tenon of the second support post into the accommodation space of the elastic snap sleeve.
Figure 3B:
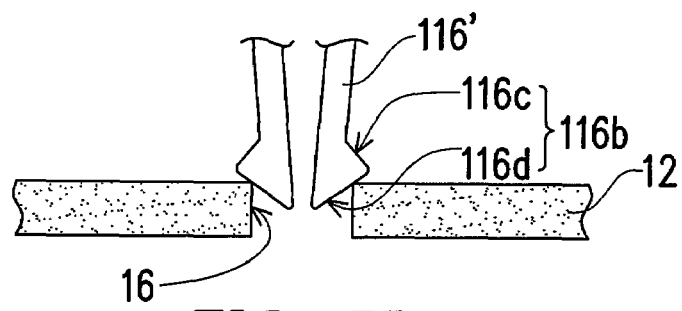
Figure 3C:
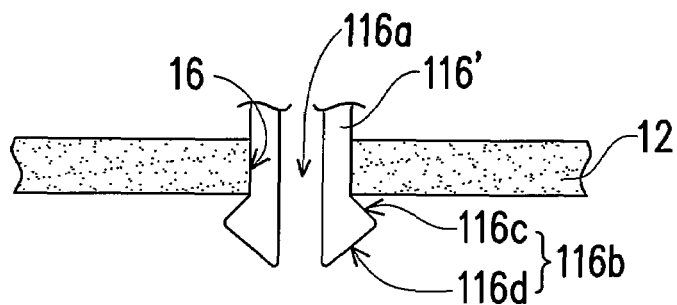

In the embodiment, the protrusion portion 116b has a slide facet 116d and a latch facet 116c. As to assembling the elastic snap sleeve 116 into the snap hole 16, the slide facets 116d of the snappers 116' are pressed towards the center line of the elastic snap sleeve 116 and due to the radial position restriction of the snap hole 16, get elastically deformed (as shown by FIGS. 3A and 3B). After the elastic snap sleeve 116 passes through the snap hole 16, the snappers 116' are sprung back to their initial states due to no radial position restriction of the snap hole 16 against the snappers 116' at the point at all, which makes the latch facets 116c hold the bottom surface of the circuit board 12 for latching.

Figure 3D:
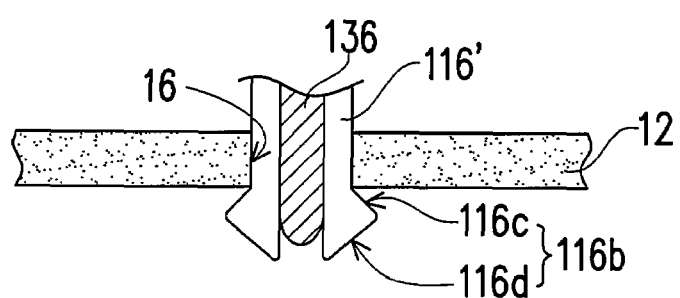

It should be noted that as the elastic snap sleeves 116 of the holding unit 110 are elastically snapped in the snap holes 16 of the circuit board 12, the snap tenons 136 of the second support posts 134 of the cover unit 130 would be plugged into the accommodation spaces 116a of the first support posts 114 of the holding unit 110. In this way, the snap tenons 136 of the second support posts 134 of the cover unit 130 prevent the snappers 116'of the first support posts 114 of the holding unit 110 from elastic radial shrinking (as shown by FIG. 3D), which secures the snappers 116'of the first support posts 114 of the holding unit 110 from easily separated off from the snap holes 16 of the circuit board 12 under any external force (causing a deformation). Thus, the heat dissipation module 100 is able to remain firmly snapped in the snap holes 16 of the circuit board 12.

In an embodiment of the present invention, the snap tenons 136 of the second support posts 134 of the cover unit 130 closely fit, for example, the inner walls of the elastic snap sleeves 116 of the first support posts 114 of the holding unit 110 to firmly secure the elastic snap sleeves 116 in the snap holes 16. To disassemble the heat dissipation module 100 from the snap holes 16, the cover unit 130 is separated from the holding unit 110 (the snap tenons 136 by drawing it out from the accommodation spaces 116a at the moment), which is able to take down the holding unit 110 that is elastically snapped in the snap holes 16 on the circuit board 12.

In addition, to smoothly plug the snap tenon 136 of the second support posts 134 of the cover unit 130 into the accommodation space 116a of the elastic snap sleeve 116, a guiding portion 160 is disposed on the first support posts 114 in the embodiment and the guiding portion 160 is used to guide the corresponding second support posts 134, so as to precisely plug the snap tenon 136 of the second support posts 134 into the accommodation spaces 116a.

In an embodiment of the present invention, in order to firmly assemble the cover unit 130 on the holding unit 110, multiple third snap portions 170 are disposed around the cover case 132 of the cover unit 130, while multiple forth snap portions 180 are disposed around the holder base 112 of the holding unit 110. By snapping the third snap portions 170 and forth snap portions 180 together, the cover unit 130 is further firmly secured on the holding unit 110 such that cover unit 130 does not come loose under any external force. In an embodiment of the present invention, the third snap portion 170 is, for example, a snap hook, while the fourth snap portion 180 is, for example, a snap slot. According to other embodiments of the present invention, the third snap portion 170 can be a snap slot, while the fourth snap portion 180 can be a snap hook.

According to other embodiments of the present invention, the holding unit 110 can be firmly assembled on the circuit board 12 in different ways. For example, the holding unit 110 can be assembled by using any feasible methods known to those skilled in the art. For example, a snap guiding slot can be disposed on the circuit board 12 and a snap portion formed on the holding unit 110 can be snapped between the snap portion and the snap guiding slot to fasten the holding unit 110 on the circuit board 12. The holding unit 110 can also be directly welded on the circuit board 12 or fastened on the circuit board by any other means.

In other embodiments of the present invention, if the holding unit 110 is directly and firmly disposed on the circuit board 12, it allows to exempt the cover unit 130 from disposing the second support post 134 thereon but the cover unit 130 and the holding unit 110 are required to be combined together.

In summary, the holding unit of the heat dissipation module provided by the embodiment of the present invention is elastically snapped in the snap holes of the circuit board through multiple elastic snap sleeves, the fan is assembled on the holder base to dissipate the heat source and the cover unit covers the fan and is assembled on the holding unit. In addition, the snap tenons of the second support posts of the cover unit are plugged in the accommodation spaces of the elastic snap sleeves of the first support posts, which makes the elastic snap sleeves snapped in the snap holes difficult to get elastic deformation and further firmly snapped in the snap holes. The problems of the prior art, where the airflow produced by a system fan is easily affected by the fluid resistance (caused by the power cords or the board cards inside the electronic device), or there is little chance to dispose a wind-guiding duct due to the space limitation, which results in a poor heat dissipation efficiency of the heat source; may be effectively reduced by the heat dissipation module of the present invention. Accordingly, the heat dissipation module provided by the embodiment of the presented invention has the following advantages:

(1) The heat dissipation module provided by the embodiment of the presented invention can be directly disposed above the heat source to effectively dissipate heat generated by the heat source to provide an optimal operating temperature to the electronic device.

(2) According to an embodiment of the present invention, only by using the elastic snap sleeves incorporated with the snap tenons, the heat dissipation module is firmly snapped in the snap holes. In other words, the heat dissipation module provided by the embodiment of the presented invention can be easily assembled/disassembled in/from an electronic device and thereby contributing to save the labor and the assembly cost, and also provide greater convenience to users.

(3) The heat dissipation module of the present invention is assembled in a limited space inside an electronic device by snapping into multiple snap holes disposed around the heat source. That is to say that the heat dissipation module provided by the embodiment of the present invention is disposed in a limited space inside an electronic device without changing the currently-used system dissipation mode.

It will be apparent to those skilled in the art that various modifications and variations can be made to the structure of the presented invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A heat dissipation module, suitable for being assembled in multiple snap holes on a circuit board to dissipate heat generated by at least one heat source disposed on the circuit board, the heat dissipation module comprising:
a holding unit, comprising a holder base and multiple first support posts formed from extending the holder base;
a fan, assembled on the holder base, for dissipating heat generated by the heat source; and
a cover unit, comprising a cover case for covering the fan and multiple second support posts corresponding to the first support posts, wherein the second support posts are respectively combined with the first support posts to assemble the fan between the holding unit and the cover unit.

2. The heat dissipation module as recited in claim 1, wherein each of the first support posts comprises an elastic snap sleeve, and wherein the elastic snap sleeves are snapped in the snap holes on the circuit board.

3. The heat dissipation module as recited in claim 2, wherein each of the elastic snap sleeves comprises an accommodation space, each of the second support posts comprises a snap tenon, and wherein the snap tenons are respectively disposed in the accommodation spaces.

4. The heat dissipation module as recited in claim 3, wherein each of the elastic snap sleeves comprises multiple split slots to shape multiple snappers out of the elastic snap sleeve, an end of each snapper respectively comprises a protrusion portion, and wherein the protrusion portions are snapped in the snap holes, wherein the split slots pass to the elastic snap sleeve itself.

5. The heat dissipation module as recited in claim 4, wherein each of the protrusion portions respectively has a slide facet and a latch facet, the snappers are plugged in the snap holes through the slide facets such that the latch facets hold a bottom surface of the circuit board for latching.

6. The heat dissipation module as recited in claim 1, wherein each of the first support posts respectively has a guiding portion to guide the corresponding second support post.

7. The heat dissipation module as recited in claim 1, wherein the fan has multiple first snap portions and the holding unit further comprises multiple second snap portions corresponding to the first snap portions to snap the first snap portions and the second snap portions together.

8. The heat dissipation module as recited in claim 7, wherein the first snap portions are locking holes, while the second snap portions are snap hooks.

9. The heat dissipation module as recited in claim 1, wherein the cover unit further comprises multiple third snap portions disposed at the cover case, the holding unit further comprises multiple fourth snap portions disposed at the holder base and the third snap portions and the fourth snap portions are snapped to each other.

10. An electronic device, comprising:
a circuit board, having multiple memory modules plugged and disposed thereon, comprising multiple snap holes located around the memory modules; and
a heat dissipation module, assembled on the circuit board, for dissipating heat generated by the memory modules on the circuit board, the heat dissipation module comprising:
a holding unit, comprising a holder base and multiple first support posts formed by extending the holder base, wherein the holding unit is assembled on the circuit board through the first support post;
a fan, assembled on the holder base, for dissipating heat generated by the heat source; and
a cover unit, comprising a cover case covering the fan and multiple second support posts corresponding to the first support posts, wherein the second support posts are respectively combined with the first support posts to assemble the fan between the holding unit and the cover unit.

11. The electronic device as recited in claim 10, wherein each of the first support posts further comprises an elastic snap sleeve and the elastic snap sleeves are snapped in the snap holes on the circuit board.

12. The electronic device as recited in claim 11, wherein each of the elastic snap sleeves comprises an accommodation space, each of the second support posts has a snap tenon and the snap tenons are respectively located in the accommodation spaces.

13. The electronic device as recited in claim 12, wherein each of the elastic snap sleeves comprises multiple split slots to shape multiple snappers out of the elastic snap sleeve, an end of each snapper respectively has a protrusion portion and the protrusion portions are snapped in the snap holes, wherein the split slots pass to the elastic snap sleeve itself.

14. The electronic device as recited in claim 13, wherein each of the protrusion portions respectively has a slide facet and a latch facet, the snappers are plugged in the snap holes through the slide facets and the latch facets hold a bottom surface of the circuit board for latching.

15. The electronic device as recited in claim 10, wherein each of the first support posts respectively comprises a guiding portion to guide the corresponding second support post.

16. The electronic device as recited in claim 10, wherein the fan comprises multiple first snap portions and the holding unit comprises multiple second snap portions corresponding to the first snap portions to snap the first snap portions and the second snap portions together.

17. The electronic device as recited in claim 16, wherein the first snap portions are locking holes, while the second snap portions are snap hooks.

18. The electronic device as recited in claim 10, wherein the cover unit further comprises multiple third snap portions disposed at the cover case, the holding unit further comprises multiple fourth snap portions disposed at the holder base and the third snap portions and the fourth snap portions are snapped to each other.

* * * * *